(12) United States Patent
Moczygemba (10) Patent No.: US 10,999,925 B2
(45) Date of Patent: May 4, 2021

(54) STRETCHABLE CONDUCTOR CIRCUIT

(71) Applicant: II-VI Delaware, Inc., Wilmington, DE (US)

(72) Inventor: Josh Moczygemba, Winona, TX (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/136,210

(22) Filed: Sep. 19, 2018

(65) Prior Publication Data

US 2020/0092988 A1 Mar. 19, 2020

(51) Int. Cl.
| | |
|---|---|
| *H05K 1/03* | (2006.01) |
| *H05K 1/02* | (2006.01) |
| *H01B 1/22* | (2006.01) |
| *H05K 1/18* | (2006.01) |
| *H01B 1/12* | (2006.01) |
| *H01B 7/04* | (2006.01) |
| *H05K 1/09* | (2006.01) |
| *A41D 1/00* | (2018.01) |

(52) U.S. Cl.
CPC ........... *H05K 1/0271* (2013.01); *H01B 1/124* (2013.01); *H01B 1/22* (2013.01); *H01B 7/04* (2013.01); *H05K 1/0283* (2013.01); *H05K 1/038* (2013.01); *H05K 1/0393* (2013.01); *H05K 1/09* (2013.01); *H05K 1/185* (2013.01); *A41D 1/005* (2013.01); *H05K 2201/09681* (2013.01)

(58) Field of Classification Search
CPC ...... A61B 5/6804; A61B 5/6805–6808; G06F 1/163; B32B 2307/202; B32B 17/064; H05K 1/0271; H05K 1/0283; H05K 1/038; H05K 1/0393; H05K 1/185; H05K 1/09; H05K 2201/09681; H01B 1/124; H01B 1/22; H01B 7/04; A41D 1/005; Y10T 29/49124; Y10T 29/49155; Y10T 29/49158
USPC ................................ 29/846, 847, 829, 592.1
See application file for complete search history.

(56) References Cited

U.S. PATENT DOCUMENTS

| | | | | |
|---|---|---|---|---|
| 3,149,406 A | * | 9/1964 | Eisler ....................... | H01B 1/00 29/611 |
| 3,414,666 A | * | 12/1968 | Doundoulakis ........ | H01B 13/02 174/261 |
| 3,571,647 A | * | 3/1971 | Robinson ............... | H05B 33/12 313/509 |
| 3,699,590 A | * | 10/1972 | Webber .................. | A41B 17/00 361/220 |
| 3,711,627 A | * | 1/1973 | Maringulov ........... | H01B 7/083 174/255 |

(Continued)

*Primary Examiner* — Peter Dungba Vo
*Assistant Examiner* — Kaying Kue
(74) *Attorney, Agent, or Firm* — Blank Rome LLP (57) ABSTRACT

This disclosure provides a stretchable conductor structure, a garment with a stretchable conductor structure, and a method for producing a stretchable conductor structure. The conductive structure includes a set of conductive wires and a stretchable laminate. The set of conductive wires, each including a protective surface, the set of conductive wires patterned in a mesh structure to accommodate a manipulation while providing electrical conductivity across the set of conductive wires. The stretchable laminate encapsulates the mesh structure, the stretchable laminate can return the mesh structure of the set of conductive wires to an original state after the manipulation.

13 Claims, 7 Drawing Sheets

(56) References Cited

U.S. PATENT DOCUMENTS

| | | | | |
|---|---|---|---|---|
| 4,272,673 A * | 6/1981 | Semanaz | H01B 3/306 | 219/528 |
| 5,000,178 A * | 3/1991 | Griffith | A61N 2/00 | 600/13 |
| 5,906,004 A * | 5/1999 | Lebby | A41D 31/00 | 139/425 R |
| 6,856,715 B1 * | 2/2005 | Ebbesen | D02G 3/441 | 385/14 |
| 8,269,112 B2 * | 9/2012 | Lee | H05K 1/0283 | 174/251 |
| 2004/0244193 A1 * | 12/2004 | Jung | H05K 3/363 | 29/854 |
| 2005/0152577 A1 * | 7/2005 | Nishimura | H04R 7/04 | 381/431 |
| 2006/0160450 A1 * | 7/2006 | Chou | D03D 15/00 | 442/217 |
| 2006/0194331 A1 * | 8/2006 | Pamula | C12Q 1/6846 | 436/150 |
| 2007/0190881 A1 * | 8/2007 | Shibaoka | D03D 1/0088 | 442/228 |
| 2007/0197115 A1 * | 8/2007 | Eves | D03D 1/0088 | 442/194 |
| 2009/0057290 A1 * | 3/2009 | Williams | H05B 3/342 | 219/211 |
| 2010/0198038 A1 * | 8/2010 | Nagata | A61B 5/04085 | 600/372 |
| 2011/0130060 A1 * | 6/2011 | Chung | D02G 3/12 | 442/189 |
| 2012/0170232 A1 * | 7/2012 | Bhattacharya | D03D 3/005 | 361/749 |
| 2014/0103116 A1 * | 4/2014 | Martin | G06K 19/0776 | 235/488 |
| 2014/0172134 A1 * | 6/2014 | Meschter | A61B 5/6804 | 700/91 |
| 2014/0191211 A1 * | 7/2014 | Chabrecek | D03D 1/0088 | 257/40 |
| 2015/0373831 A1 * | 12/2015 | Rogers | H01L 23/22 | 429/121 |
| 2015/0373838 A1 * | 12/2015 | Sawada | C09D 105/16 | 136/256 |
| 2016/0000374 A1 * | 1/2016 | Dandekar | A61B 5/6804 | 600/301 |
| 2016/0331989 A1 * | 11/2016 | Cho | A61N 1/0484 | |
| 2016/0338644 A1 * | 11/2016 | Connor | A61B 5/4528 | |
| 2017/0029985 A1 * | 2/2017 | Tajitsu | D03D 15/00 | |
| 2017/0192574 A1 * | 7/2017 | Koike | G06F 3/047 | |
| 2017/0196514 A1 * | 7/2017 | Moltani | A61B 5/6804 | |
| 2017/0224280 A1 * | 8/2017 | Bozkurt | G01L 5/0014 | |
| 2018/0153033 A1 * | 5/2018 | Sugita | D04H 3/015 | |

* cited by examiner

STRETCHABLE CONDUCTOR CIRCUIT

TECHNICAL FIELD

The present application relates generally to electrical conductors and, more specifically, to a stretchable conductor circuit.

BACKGROUND

Current state of the art practice is to pattern solid copper foils in a meandering trace (horseshoe pattern) and embed in a polymer. Though this does provide for stretchable and flexible circuit (though typically in one axis of the conductor at a time), high stress concentration along the curves of the trace leading to plastic deformation of the conductor can develop that over time cause circuit failure (open circuit).

SUMMARY

This disclosure provides a stretchable conductor circuit.

In a first embodiment, a stretchable conductive structure includes a set of conductive wires and a stretchable laminate. The set of conductive wires, each including a protective surface, the set of conductive wires patterned in a mesh structure to accommodate a manipulation while providing electrical conductivity across the set of conductive wires. The stretchable laminate encapsulates the mesh structure, the stretchable laminate is configured to return the mesh structure of the set of conductive wires to an original state after the manipulation.

In a second embodiment, a garment includes a fabric and a flexible conductor structure disposed within or adjacent to the fabric. The flexible conductive circuit includes one or more circuit components and a stretchable conductor structure connecting the one or more circuit components. The stretchable conductor structure includes a set of conductive wires and a stretchable laminate. The set of conductive wires, each including a protective surface, the set of conductive wires patterned in a mesh structure to accommodate a manipulation while providing electrical conductivity across the set of conductive wires. The stretchable laminate encapsulates the mesh structure, the stretchable laminate is configured to return the mesh structure of the set of conductive wires to an original state after the manipulation.

In a third embodiment, a method provides for manufacturing a stretchable conductor structure. The method includes applying a protective surface to each of a set of conductive wires; patterning the set of conductive wires into a mesh structure that accommodates a manipulation while providing electrical conductivity across the set of conductive wires; and encapsulating the mesh structure in a stretchable laminate in a manner that the stretchable laminate returns the set of conductive wires to the mesh structure of the set of conductive wires to an original state after the manipulation ends.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 5, discussed below, and the various embodiments used to describe the principles of the present disclosure in this patent document are by way of illustration only and should not be construed in any way to limit the scope of the disclosure.

Figure 1A:
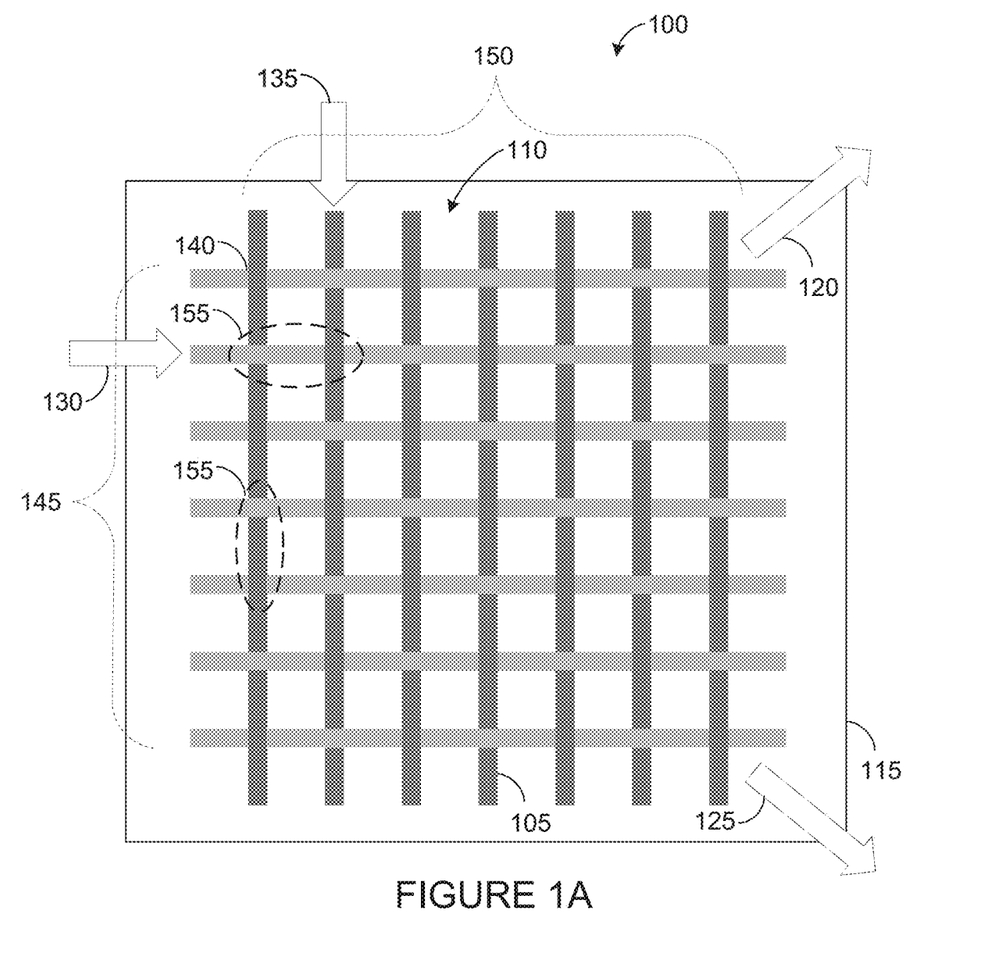
FIGS. 1A-1C illustrate example stretchable conductor structures according to this disclosure.
Figure 1B:
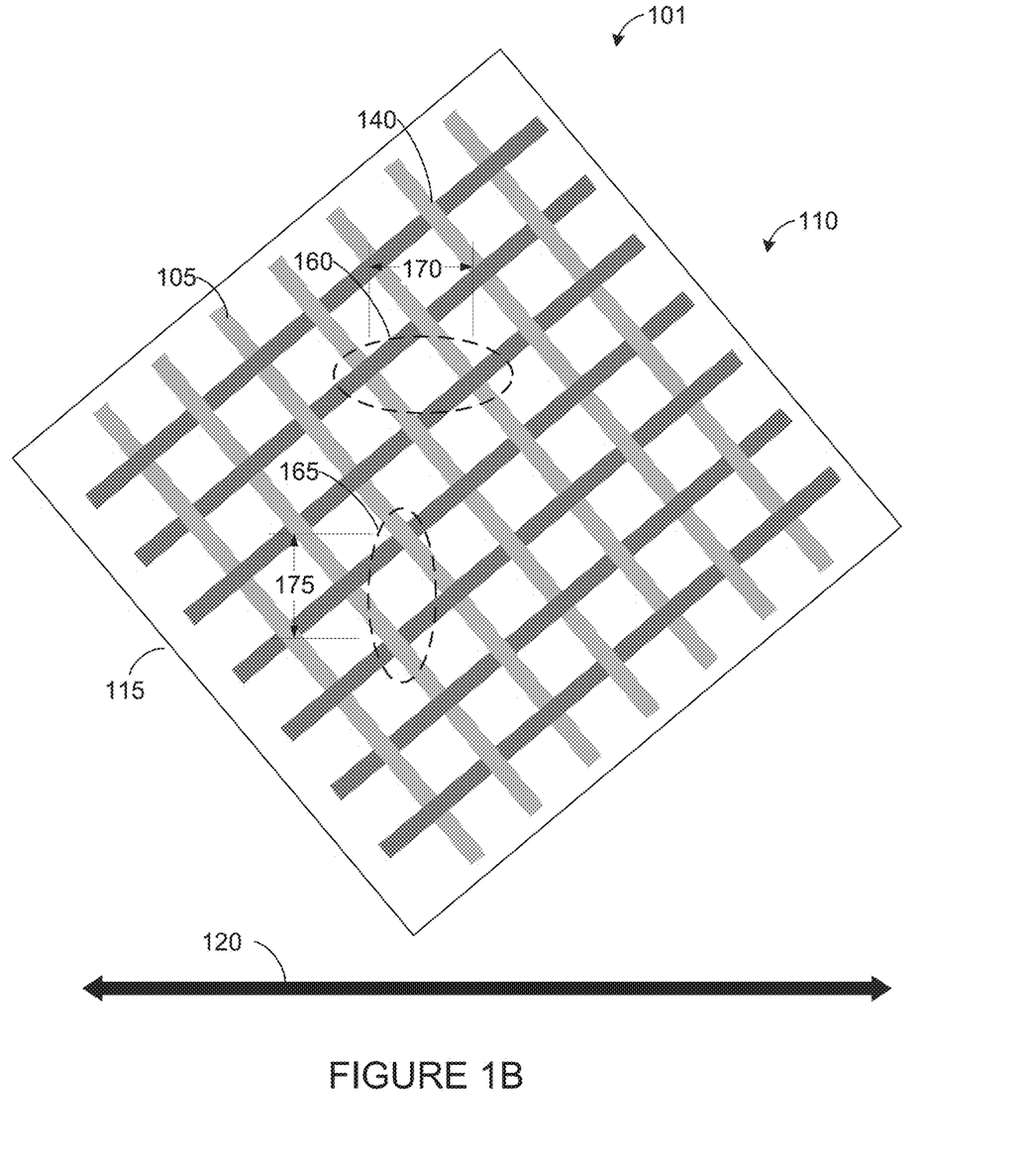
Figure 1C:
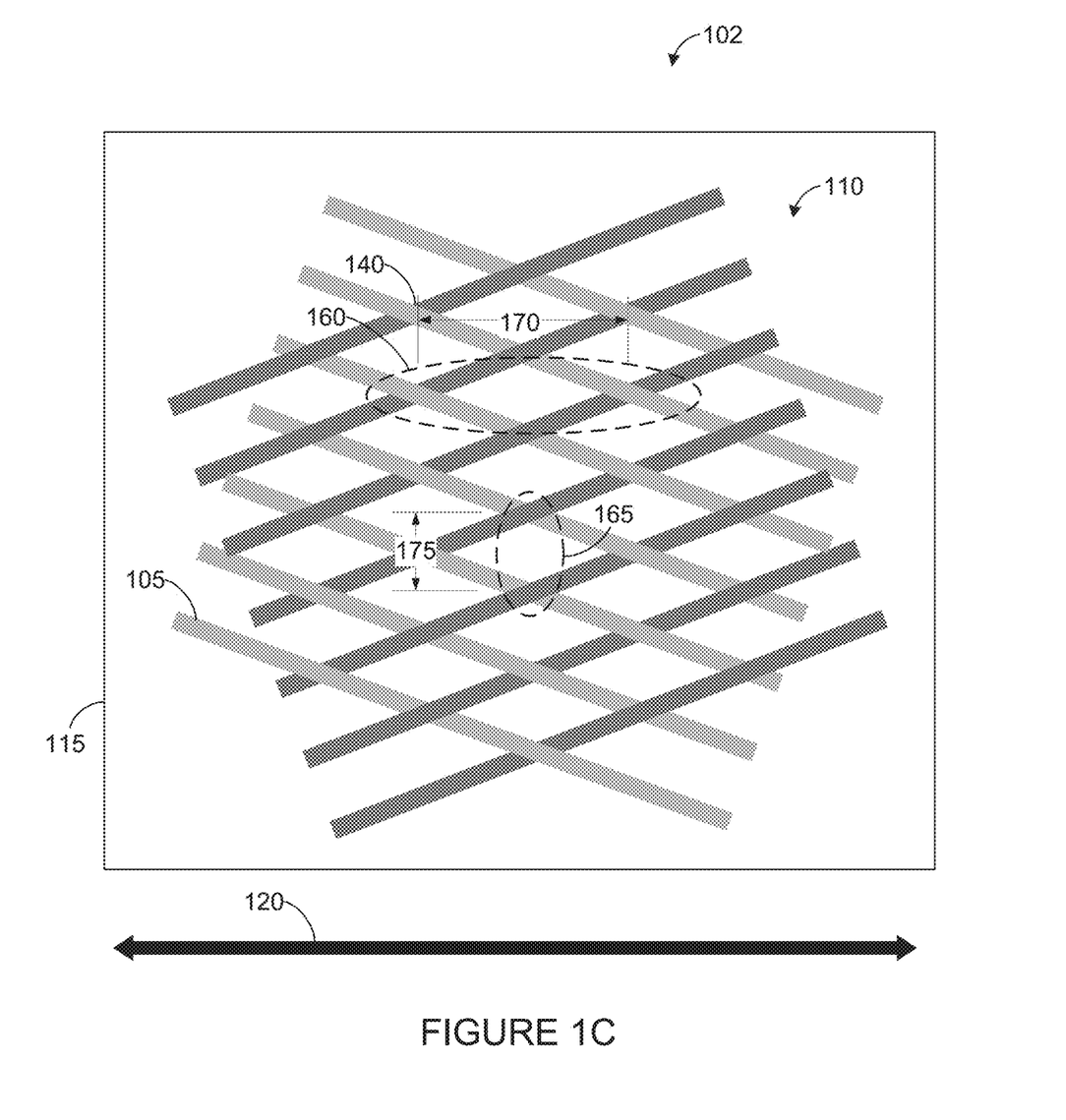

FIGS. 1A-1C illustrate example stretchable conductor structure according to this disclosure. FIG. 1A illustrates an example stretchable conductor structure 100 according to this disclosure. FIG. 1B illustrates an example un-stretched conductor structure 101 according to various embodiments of the present disclosure. FIG. 1C illustrates an example stretched conductor structure 102 according to the embodiments of the present disclosure. The embodiments shown in FIGS. 1A-1C are for illustration only. Other embodiments could be used without departing from the scope of the present disclosure.

FIGS. 1A-1C illustrate a novel flexible and stretchable conductor structure 100 capable of conducting relatively high electrical current. The flexible conductor structure 100 is suited for wearable electronics, but is also compatible with other applications requiring flex/stretch circuits. The flexible conductor structure 100 is comprised of a patterned conductive wire 105 in a mesh structure 110, for example, woven or knitted, that is covered in a stretchable laminate 115.

A material, for example, copper, aluminum, silver, etc. can be used for the set of conductive wires 105. The conductive wires 105 may not be stretchable, but can be formed into a mesh structure 110 that provides a flexibility of the overall conductor structure 100. The conductor wires 105 can include corrosion/oxidation protective surfaces (e.g., Ni/Au plating).

The mesh structure 110 is stretchable in the axis 120, 125 roughly diagonal (any angle but embodiment is 45 degrees) to the weft direction 130 and warp direction 135. The conductive wires 105 include a first portion 145 of conductive wires aligned in the weft direction 130 and a second portion 150 of the conductive wires 145 aligned in the warp direction 135. The first portion 145 and the second portion 150 can include different amounts of conductive wires 105. While the first portion 145 and the second portion 150 of conductive wires 105 illustrated as perpendicularly aligned in FIGS. 1A and 1B, the first portion 145 and second portion 150 can be aligned at any angle.

Using a mesh structure 110 also allows for using a pcb-type etching method to create the circuit patterns on a volume scale. A mesh circuit structured using the PCB-type etching can replace a copper foil or the conductive wires. While the term "mesh" is used throughout the Specification to describe the arrangement of conductive wires, the mesh structure is not limited to a mesh and further includes knits, braids, netting, etc. In certain embodiments, a shape of the cross section of the mesh structure 110 could be flat, round, tubular, etc. When the cross section of the mesh structure 110 is tubular, for example, could be formed around another component.

The first portion 145 and the second portion 150 of the conductive wires 105 cross each other to form a plurality of contact points 140. An adjacent contact point 155 is a contact point directly connected by a length of conductive wire 105. Adjacent contact points 155 have alternate overlaps of the first portion 145 and the second portion 150. For example, each adjacent contact point 155 to a contact point 140, where a conductive wire 105 of the first portion 145 crosses over a conductive wire 105 of the second portion 150, has a conductive wire 105 of the second portion 150 crossing over a conductive wire 105 of the first portion 145.

A diagonal contact point 160, 165 is a contact point 140 that is directly across a gap between contact points. Diagonal contact points can be aligned contact points 160 or un-aligned contacts points 165 compared to the manipulation direction 120. The aligned contact points 160 are contact points 140 directly across a gap that align with the manipulation direction 120. The un-aligned contact points 165 are contact points 140 directly across a gap that are perpendicular or not aligned with the manipulation direction 120.

In certain embodiments, a distance 170 between aligned contact points 160 in an original state of the mesh structure 110 is relatively similar to a distance 175 between un-aligned contact points 165. During a stretching manipulation 200, the distance 170 between the aligned contact points 160 increases and the distance 175 between the un-aligned contact points 165 decreases. After the stretching manipulation 200 ends, the distances 170, 175 return to the original state of the mesh structure 110.

An example of the stretching is illustrated by the un-stretched conductor structure 101 where the mesh structure 110 is in an original state in FIG. 1B and the stretched conductor structure 102 where the mesh structure 110 is in a manipulated state in FIG. 1C. For ease of illustration, the ends of the conductive wires 105 and the stretchable laminate 115 could extend further than what is illustrated in FIGS. 1B and 1C. Conductor structure 102 illustrates the conductive wires 105 somewhat aligning with the stretch direction 120 from the original positions of the un-stretched conductor structure 101. The mesh structure 110 allows each conductor strand to slide against adjacent conductor strands rather than plastically deform. The numerous metal to metal contact points 140 (preferably Ni/Au plated copper) provide low resistance means of transferring electrical current between adjacent conductor threads.

Once the conductive wires 105 are patterned in mesh structure 110, the mesh structure 110 is laminated using stretchable material or stretchable laminate 115. The mesh structure 110 can be embedded in the stretchable laminate 115. The mesh structure 110 can be double-sided coated using a pressure sensitive adhesive on a stretchable polymer material (examples are silicone, thermoplastic polyurethane, etc.) that adheres to the mesh pattern and provides for the mesh structure to return to the original shape or the mesh structure 110 in the un-stretched conductor structure 101 after a manipulation, such as flexing or stretching. The polymer also can serve as an electrical insulator for the conductor wires 105.

In one embodiment, a permanently adhered flexible and/or stretchable conductive coating such as a conductive ink, a conductive polymer, or a conductive epoxy (such as Dupont PE874) can be patterned on the mesh structure 110, prior to encapsulation in the stretchable laminate 115, for multiple purposes. One purpose is that the conductive polymer aids in further improving and reducing the point to point electrical contact of the individual strands in the mesh, while also allowing flexing and stretching. Another purpose is that the polymer could also act as an etch mask during the circuit patterning step.

The mesh structure 110 provides for a flexible and stretchable circuit material. However, it can also be patterned using meandering horseshoe/serpentine patterns (x and y axis) and wave patterns (z-axis) to further enhance flexibility. Patterning with this type of circuit further enhances both flexibility and stretchability by minimizing high stress concentrations in the pattern as it stretches (particularly along the curves).

Figure 2A:
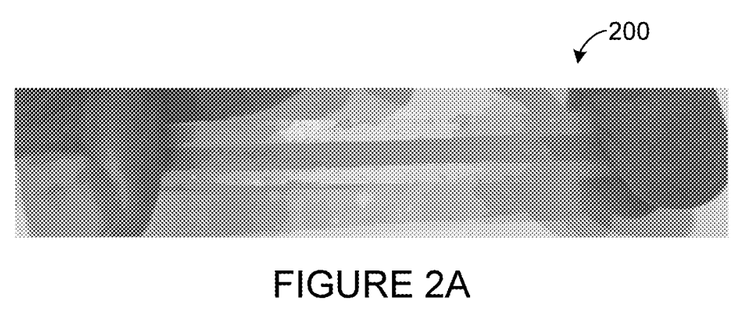
FIGS. 2A-2C illustrate exemplary manipulations of a conductor structure according to the embodiments of the present disclosure.
Figure 2B:
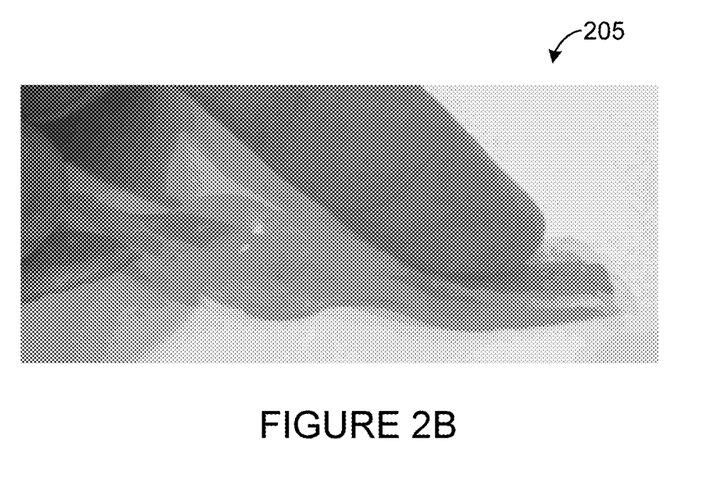
Figure 2C:
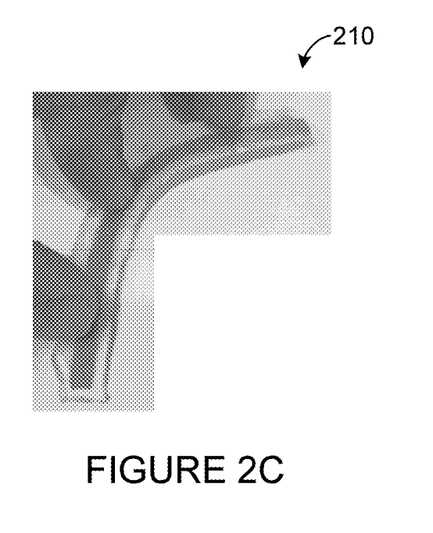

FIGS. 2A-2C illustrate exemplary manipulations of a flex conductor according to the embodiments of the present disclosure. The embodiment shown in FIG. 2 is for illustration only. Other embodiments could be used without departing from the scope of the present disclosure.

FIG. 2A illustrates a stretching manipulation 200 according to the embodiments of the present disclosure. The stretch direction 120 corresponds to a horizontal direction in reference to FIG. 2A. The stretchable laminate 115 provides the function of returning the conductor structure to its original mesh structure.

FIG. 2B illustrates a twisting manipulation 205 according to the embodiments of the present disclosure. The twisting manipulation 205 provides an inconsistent stretch across the conductor structure. Each connection point 140 allows different sections of the conductor structure to provide different amounts of "stretch" to allow the twisting of the conductor structure.

FIG. 2C illustrates a bending manipulation 210 according to the embodiments of the present disclosure. The bending manipulation 210 involves one side of the flexible conductor structure stretching while the opposite side is in contraction. The flexibility of the conductor structure also for this manipulation and the return from to an un-bended mesh structure.

Figure 3:
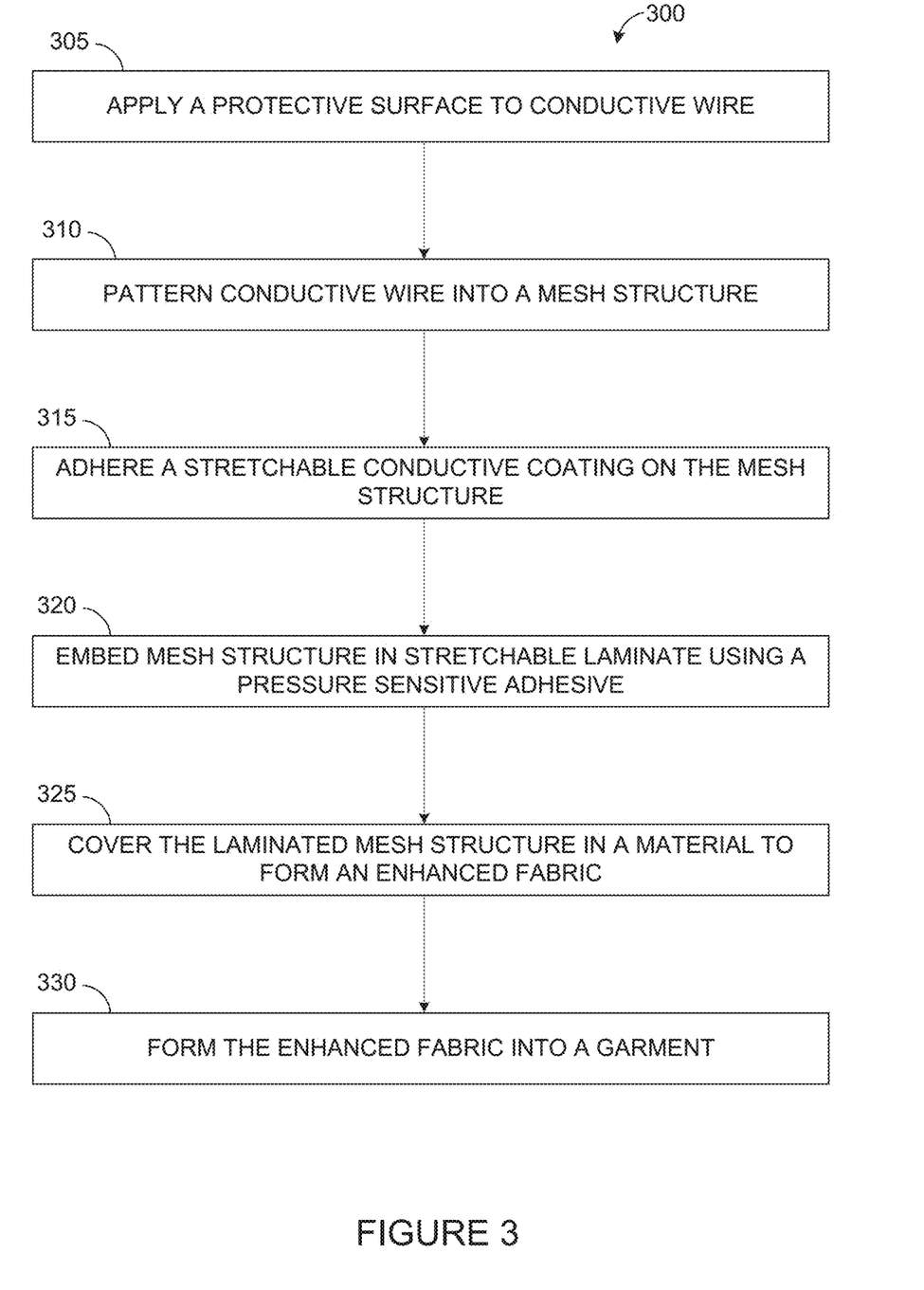
FIG. 3 illustrates an example process for a stretchable conductor structure according to this disclosure.

FIG. 3 illustrates an example process for a stretchable flex conductor according to this disclosure. For example, the process depicted in FIG. 3 may be performed to produce the enhanced garment in FIG. 4 or the enhanced garment in FIG. 5.

In operation 305, a protective surface is applied to the conductive wires 105. The protective surface can be a Ni/Au plating for example. The protective surface provides a resilience to the conductive wires 105 to lengthen the over useful life of the conductor structure and also provide a greater transmission of current between adjacent conductive wires 105. In certain embodiments, the protective surface can provide corrosion resistance and oxidation resistance. In certain embodiments, the protective surface is applied after the conductive wires 105 are patterned into the mesh structure in operation 310.

In operation 310, the conductive wires 105 are patterned into a mesh structure 110. The conductive wires 105 can be woven or knitted in a mesh structure 110. The mesh structure 110 can accommodate a manipulation, such as a stretching manipulation 200, a twisting manipulation 205, and a bending manipulation 210. The mesh structure 110 can also include meandering horseshoe, meandering serpentine patterns, and wave patterns.

In operation 315 a stretchable conductive coating can be applied on the mesh structure 110. The conductive coating 110 can be applied as a pattern on the mesh structure 110, or around the contact points of the mesh structure 110. The conductive coating can be, for example, a conductive ink, a conductive polymer, or a conductive epoxy. The conductive coating enhances the electrical connection between strands of the conductive wires 105. In certain embodiments, the mesh structure can be patterned into a circuit by processes such as etching pcbs.

In operation 320, the mesh conductor is embedded in a stretchable laminate using a pressure sensitive adhesive. The stretchable laminate can be a stretchable polymer material. The stretchable laminate returns the un-stretched mesh structure after a manipulation ends. In certain embodiments, a liquid laminate is cast around the mesh structure and allowed to cure.

In operation 325, the embedded mesh conductor is covered with a material to form an enhanced fabric. The conductor structure can spread across the entire fabric or portions of the fabric.

In operation 330, the enhanced fabric is formed into a garment. The conductor structure could run in strands of the garment from specific components, connections, sensors, interfaces, etc.

Although FIG. 3 illustrates an example a process for a stretchable flex conductor, respectively, various changes could be made to FIG. 3. For example, while shown as a series of steps, various steps in each figure could overlap, occur in parallel, occur in a different order, or occur multiple times.

Figure 4:
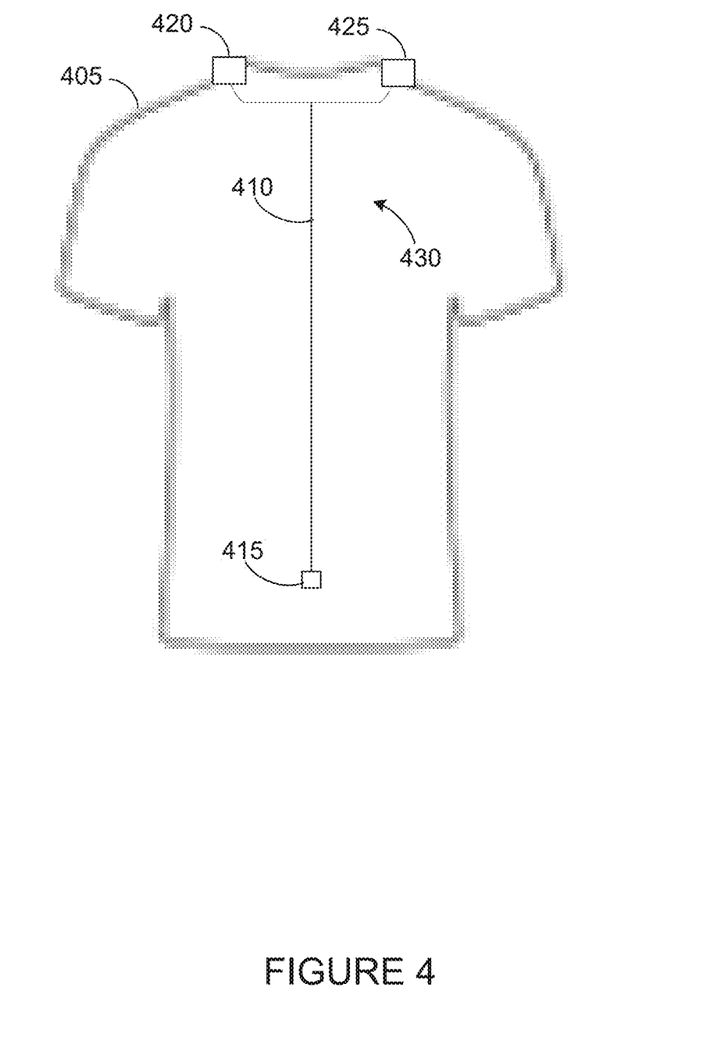
FIG. 4 illustrates an example enhanced garment according to this disclosure.

FIG. 4 illustrates an example enhanced garment 400 according to this disclosure. The embodiment shown in FIG. 4 is for illustration only. Other embodiments could be used without departing from the scope of the present disclosure.

The enhanced garment 400 is a garment 405 that includes a stretchable conductor structure 410 either embedded in the fabric of the garment 405 or external to the garment 405. The stretchable conductor structure connects and powers electrical components in the garment 405 or around the garment 405. The placement, routing, and directions of the stretchable conductor structure 410 and the component 415, 420 and 425 are for illustration only and could be located anywhere along the garment 405.

The enhanced garment 400 can include connections 415, sensors 420, or other components 425. The flexible conduct circuit 430 includes the flexible conductor structure 410, the connections 415, the sensors 420 and the other components 425. Because the flexible conductor structure 410 is insulated, the components can provide interfaces or connections without exposing the flexible conductor structure 410. These components allow user to not worry about the electrical current running through the flexible conductor structure 410 and also protect the flexible conductor structure 410 from being damaged. The connection of the components 415, 420 and 425 are described in further detail below corresponding to the components of FIG. 5.

Figure 5:
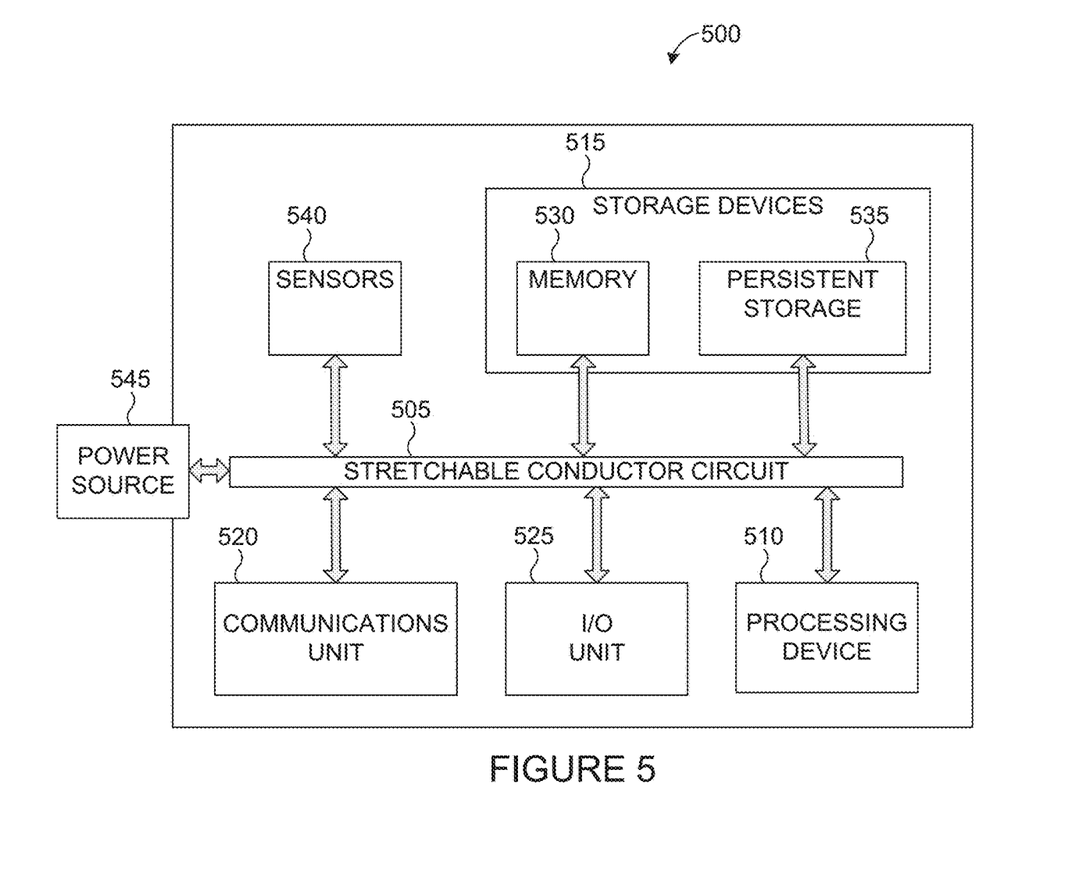
FIG. 5 illustrates an example enhanced garment according to this disclosure.

FIG. 5 illustrates an example enhanced garment 500 according to this disclosure. The embodiment shown in FIG. 5 is for illustration only. Other embodiments could be used without departing from the scope of the present disclosure.

As shown in FIG. 5, the enhanced garment 500 includes a flexible conductor structure 505, which supports communication between at least one processing device 510, at least one storage device 515, at least one communications unit 520, at least one input/output (I/O) unit 525, at least one sensor 540, and at least one power source 545.

The processing device 510 executes instructions that may be loaded into a memory 530. The processing device 510 may include any suitable number(s) and type(s) of processors or other devices in any suitable arrangement. Example types of processing devices 510 include microprocessors, microcontrollers, digital signal processors, field programmable gate arrays, application specific integrated circuits, and discreet circuitry.

The memory 530 and a persistent storage 535 are examples of storage devices 515, which represent any structure(s) capable of storing and facilitating retrieval of information (such as data, program code, and/or other suitable information on a temporary or permanent basis). The memory 530 may represent a random access memory or any other suitable volatile or non-volatile storage device(s). The persistent storage 535 may contain one or more components or devices supporting longer-term storage of data, such as a ready only memory, hard drive, flash memory, or optical disc.

The communications unit 520 supports communications with other systems or devices. For example, the communications unit 520 could include a network interface card or a wireless transceiver facilitating communications over the network 102. The communications unit 520 may support communications through any suitable physical or wireless communication link(s).

The I/O unit 525 allows for input and output of data. For example, the I/O unit 525 may provide a connection for user input through a keyboard, mouse, keypad, touchscreen, or other suitable input device. The I/O unit 525 may also send output to a display, printer, or other suitable output device. The I/O unit 525 can be the connections 415 illustrated in FIG. 4.

The sensor 540 can provide feedback to the user or stored in the storage device 515. Sensors 540 can include temperature sensors, pressure sensors, biometric sensors, etc.

The power source 545 provides the power to the components of the enhanced garment 500 through the stretchable conduct circuit 505. The power source 545, for example, can be a rechargeable battery or wall supply. The power source 545 can be removably coupled to the enhanced garment or be built in to the enhanced garment 500 with an external connection.

As described in more detail above, components of the enhanced garment 500 can be connected using a stretchable conductor structure 505. The components of the electronic device can also be attached to an enhanced garment or external to the enhanced garment.

The stretchable conductor structure 505 can also provide power to the different components of the enhanced garment.

Although FIG. 5 illustrates an example of an enhanced garment 500, various changes may be made to FIG. 5. For example, various components in FIG. 5 could be combined, further subdivided, or omitted and additional components could be added according to particular needs. As a particular example, the processing device 510 could be divided into multiple processors, such as one or more central processing units (CPUs) and one or more graphics processing units (GPUs). In addition, as with computing and communication networks, electronic devices can come in a wide variety of configurations, and FIG. 5 does not limit this disclosure to any particular electronic device.

Although the present disclosure has been described with exemplary embodiments, various changes and modifications may be suggested to one skilled in the art. It is intended that the present disclosure encompass such changes and modifications as fall within the scope of the appended claims.

What is claimed is:

1. A method for producing a flexible and stretchable conductor structure comprising:
    applying a protective surface to each of a set of conductive wires;
    patterning the set of conductive wires into a mesh structure that accommodates a manipulation while providing electrical conductivity across the set of conductive wires; and
    encapsulating the mesh structure in a stretchable laminate such that the stretchable laminate encloses the mesh structure embedded inside of the stretchable laminate, in a manner that the stretchable laminate returns the set of conductive wires to the mesh structure of the set of conductive wires to an original state after the manipulation.

2. The method of claim 1, further comprising stretching the mesh structure in direction at an equal angle from a weft direction and a warp direction.

3. The method of claim 2, further comprising returning the mesh structure to an original form after the stretching by the stretchable laminate.

4. The method of claim 1, further comprising: patterning a stretchable electrically conductive coating on the mesh structure of the set of conductive wires.

5. The method of claim 1, wherein the mesh structure comprises:
    a first portion of the set of conductive wires aligned in a weft direction, and
    a second portion of the set of conductive wires aligned in a warp direction,
    the first portion and the second portion of the set of conductive wires cross each other to form a plurality of contact points,
    adjacent contact points of the plurality of contact points have alternate overlaps of the first portion and the second portion of the set of conductive wires, and
    diagonal contact points of the plurality of contact points have same overlaps of the first portion and the second portion of the set of conductive wires.

6. The method of claim 5, wherein:
    the manipulation is a stretching that occurs at an angle relative to the weft direction and the warp direction,
    a first distance, between the diagonal contact points aligned with the direction of the stretching, increases with the manipulation, and
    a second distance, between the diagonal contact points perpendicular to the direction of the stretching, decreases with the manipulation.

7. The method of claim 6, wherein the first distance and the second distance are the same distance in the original state of the mesh structure.

8. The method of claim 1, wherein the protective surface comprises a material that provides protection from corrosion and oxidation.

9. The method of claim 1, wherein the protective surface is at least one of a nickel and gold plating.

10. The method of claim 1, wherein the stretchable laminate is an electrical insulator for the set of conductive wires in the mesh structure.

11. The method of claim 1, wherein the mesh structure includes the conductive wires patterned using a meandering horseshoe pattern.

12. The method of claim 1, further comprising disposing the flexible and stretchable conductor structure within to a fabric.

13. The method of claim 12, further comprising forming the fabric into a garment.

* * * * *